(12) United States Patent
Wang et al.

(10) Patent No.: US 11,302,894 B2
(45) Date of Patent: Apr. 12, 2022

(54) DISPLAY SUBSTRATE, METHOD FOR MANUFACTURING THE SAME AND DISPLAY DEVICE

(71) Applicant: BOE TECHNOLOGY GROUP CO., LTD., Beijing (CN)

(72) Inventors: Youwei Wang, Beijing (CN); Song Zhang, Beijing (CN); Peng Cai, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 126 days.

(21) Appl. No.: 16/770,056

(22) PCT Filed: Dec. 26, 2019

(86) PCT No.: PCT/CN2019/128649
§ 371 (c)(1),
(2) Date: Jun. 4, 2020

(87) PCT Pub. No.: WO2020/143464
PCT Pub. Date: Jul. 16, 2020

(65) Prior Publication Data
US 2021/0193958 A1    Jun. 24, 2021

(30) Foreign Application Priority Data
Jan. 8, 2019   (CN) .......................... 201910016514.9

(51) Int. Cl.
*H01L 29/08* (2006.01)
*H01L 51/52* (2006.01)
(Continued)

(52) U.S. Cl.
CPC ...... *H01L 51/5253* (2013.01); *H01L 27/3244* (2013.01); *H01L 51/56* (2013.01); *H01L 2227/323* (2013.01)

(58) Field of Classification Search
CPC .................................................. H01L 51/5253
See application file for complete search history.

(56) References Cited

U.S. PATENT DOCUMENTS 7,538,480 B2  5/2009  Koo et al.
9,365,933 B2  6/2016  Son et al.
(Continued)

FOREIGN PATENT DOCUMENTS

CN       1731597 A    2/2006
CN    104167430 A   11/2014
(Continued)

OTHER PUBLICATIONS

Office Action issued in corresponding Chinese Patent Application No. 201910016514.9, dated Jul. 2, 2020.

*Primary Examiner* — Caleb E Henry
(74) *Attorney, Agent, or Firm* — McDermott Will & Emery LLP (57) ABSTRACT

A method for manufacturing a display substrate includes: providing a base substrate; forming at least one isolation structure around an opening area on the base substrate, wherein the isolation structure includes a first side wall including a first side and a second side, the second side is closer to the base substrate than the first side, the first side is further away from the opening area than the second side; and forming a first filling structure on a side of the first side wall away from the opening area, wherein the first filling structure includes a second side wall conforming to a shape of the first side wall and a third side wall including a third side and a fourth side, the fourth side is closer to the base substrate than the third side, the third side is closer to the opening area than the fourth side.

18 Claims, 7 Drawing Sheets

(51) Int. Cl.
*H01L 27/32* (2006.01)
*H01L 51/56* (2006.01)

(56) References Cited

U.S. PATENT DOCUMENTS

| | | | |
|---|---|---|---|
| 9,691,830 B2 | 6/2017 | Song et al. | |
| 10,038,035 B2 | 7/2018 | Xu et al. | |
| 10,205,122 B2* | 2/2019 | Choi | H01L 51/0096 |
| 10,608,205 B2 | 3/2020 | Tanisako | |
| 10,615,369 B2* | 4/2020 | Choi | H01L 27/3262 |
| 2006/0028130 A1 | 2/2006 | Koo et al. | |
| 2016/0138169 A1 | 5/2016 | Son et al. | |
| 2016/0247862 A1 | 8/2016 | Song et al. | |
| 2016/0365395 A1 | 12/2016 | Xu et al. | |
| 2017/0162111 A1* | 6/2017 | Kang | G09G 3/3233 |
| 2017/0162637 A1* | 6/2017 | Choi | H01L 21/28 |
| 2017/0237033 A1* | 8/2017 | Koshihara | H01L 51/524 257/88 |
| 2017/0237038 A1* | 8/2017 | Kim | H01L 51/0096 257/40 |
| 2017/0288004 A1* | 10/2017 | Kim | H01L 27/326 |
| 2018/0123081 A1* | 5/2018 | Baik | H01L 51/5215 |
| 2018/0197924 A1* | 7/2018 | Tada | H01L 51/5253 |
| 2018/0348913 A1* | 12/2018 | Lee | G06F 3/0443 |
| 2019/0123115 A1 | 4/2019 | Sun et al. | |
| 2019/0131574 A1 | 5/2019 | Tanisako | |
| 2019/0334120 A1* | 10/2019 | Seo | H01L 51/5246 |
| 2020/0020752 A1* | 1/2020 | Shi | H01L 51/52 |
| 2020/0075692 A1* | 3/2020 | Park | H01L 51/5253 |
| 2020/0093016 A1* | 3/2020 | Yee | H05K 5/03 |
| 2020/0185649 A1 | 6/2020 | Tanisako | |

FOREIGN PATENT DOCUMENTS

| | | |
|---|---|---|
| CN | 104900681 A | 9/2015 |
| CN | 107658332 A | 2/2018 |
| CN | 109742117 A | 5/2019 |
| JP | H11-317288 A | 11/1999 |
| JP | 2000187223 A | 7/2000 |
| JP | 2003045669 A | 2/2003 |
| JP | 2003223989 A | 8/2003 |
| KR | 20150127368 A | 11/2015 |
| WO | 2017154482 A1 | 9/2017 |

* cited by examiner

DISPLAY SUBSTRATE, METHOD FOR MANUFACTURING THE SAME AND DISPLAY DEVICE

CROSS-REFERENCE TO RELATED APPLICATION

The present disclosure is a Section 371 National Stage Application of International Application No. PCT/CN2019/128649, filed on Dec. 26, 2019, and claims the benefit of Chinese Patent Application No. 201910016514.9 filed on Jan. 8, 2019 in the National Intellectual Property Administration of China, the whole disclosure of which is incorporated herein by reference.

TECHNICAL FIELD

The present disclosure relates to a field of display technology, and in particular, to a display substrate, a method for manufacturing the same, and a display device.

BACKGROUND

In recent years, organic light emitting diode (OLED) display device has become a very popular emerging flat panel display product at home and abroad. This is because the OLED display device has characteristics of self-luminescence, wide viewing angle, short reaction time, high luminous efficiency, wide color gamut, low operating voltage, thin panel, large size and flexible panel, simple manufacturing process and the like, and it also has low-cost potential.

SUMMARY

Some embodiments of the present disclosure provide a method for manufacturing a display substrate, the display substrate having a display area, and an opening area being provided in the display area, wherein the method comprises: providing a base substrate; forming at least one isolation structure around the opening area on the base substrate, wherein the isolation structure comprises a first side wall facing away from the opening area, the first side wall comprises a first side and a second side, the second side is closer to the base substrate than the first side, the first side is further away from the opening area than the second side in a direction parallel to the base substrate; and forming a first filling structure on a side of the first side wall away from the opening area, wherein the first filling structure comprises a second side wall facing to the first side wall and a third side wall facing away from the first side wall, the second side wall conforms to a shape of the first side wall, the third side wall comprises a third side and a fourth side, the fourth side is closer to the base substrate than the third side, the third side is closer to the opening area than the fourth side in the direction parallel to the base substrate.

In some embodiments, the isolation structure further comprises a fourth side wall facing to the opening area, the fourth side wall comprises a fifth side and a sixth side, the sixth side is closer to the base substrate than the fifth side, the fifth side is closer to the opening area than the sixth side in the direction parallel to the base substrate; the method further comprises: forming a second filling structure on a side of the fourth side wall facing to the opening area, wherein the second filling structure comprises a fifth side wall facing to the fourth side wall and a sixth side wall facing away from the fourth side wall, the fifth side wall conforms to a shape of the fourth side wall, the sixth side wall comprises a seventh side and an eighth side, the eighth side is closer to the base substrate than the seventh side, the seventh side is further away from the opening area than the eighth side in the direction parallel to the base substrate.

In some embodiments, the method further comprising: filling an organic material layer on both sides of the isolation structure; and patterning the organic material layer to form the first filling structure and the second filling structure.

In some embodiments, the organic material layer is filled with an inkjet printing method.

In some embodiments, after forming the first filling structure and the second filling structure, the method further comprises: forming a first inorganic thin film covering the first filling structure and the second filling structure.

In some embodiments, before forming the first filling structure and the second filling structure, the method further comprises: forming a first inorganic thin film covering the isolation structure.

In some embodiments, the method further comprising: forming an organic protective layer on the side of the first side wall away from the opening area; wherein the organic protective layer, the first filling structure and the second filling structure are formed by the same patterning process.

In some embodiments, the method further comprising: forming a second inorganic thin film covering all of the first filling structure and second filling structure and the organic protective layer.

In some embodiments, before forming the isolation structure, the method further comprises: forming an array structure layer on the base substrate; wherein the isolation structure is formed on a side of the array structure layer away from the base substrate.

Some embodiments of the present disclosure provide a display substrate having a display area, an opening area being provided in the display area, wherein the display substrate comprises: a base substrate; at least one isolation structure provided on the base substrate and surrounding the opening area, wherein the isolation structure comprises a first side wall facing away from the opening area, the first side wall comprises a first side and a second side, the second side is closer to the base substrate than the first side, the first side is further away from the opening area than the second side in a direction parallel to the base substrate; and a first filling structure provided on a side of the first side wall away from the opening area, wherein the filling structure comprises a second side wall facing to the first side wall and a third side wall facing away from the first side wall, the second side wall conforms to a shape of the first side wall, the third side wall comprises a third side and a fourth side, the fourth side is closer to the base substrate than the third side, the third side is closer to the opening area than the fourth side in the a direction parallel to the base substrate.

In some embodiments, the isolation structure further comprises a fourth side wall facing to the opening area, the fourth side wall comprises a fifth side and a sixth side, the sixth side is closer to the base substrate than the fifth side, the fifth side is closer to the opening area than the sixth side in the direction parallel to the base substrate; the isolation structure further comprises: a second filling structure provided on a side of the fourth side wall facing to the opening area, wherein the second filling structure comprises a fifth side wall facing to the fourth side wall and a sixth side wall facing away from the fourth side wall, the fifth side wall conforms to a shape of the fourth side wall, the sixth side wall comprises a seventh side and an eighth side, the eighth side is closer to the base substrate than the seventh side, the seventh side is further away from the opening area than the eighth side in the direction parallel to the base substrate.

In some embodiments, the display substrate further comprising a first inorganic thin film covering both the first filling structure and the second filling structure.

In some embodiments, the display substrate further comprising a first inorganic thin film disposed between the isolation structure and a filling structure comprising the first filling structure and the second filling structure.

In some embodiments, the display substrate further comprising an organic protective layer provided on the side of the first side wall away from the opening area.

In some embodiments, the display substrate further comprising a second inorganic thin film covering both the filling structure and the organic protective layer.

In some embodiments, the display substrate further comprising: an array structure layer provided on the base substrate; wherein the isolation structure is disposed on a side of the array structure layer away from the base substrate.

In some embodiments, the display substrate is an OLED display substrate.

Some embodiments of the present disclosure provide a display device comprising the display substrate according to the above embodiments.

BRIEF DESCRIPTION OF THE DRAWINGS

The drawings are used to provide a further understanding of the technical solutions of the present disclosure, and constitute a part of the specification. The drawings are used to explain the technical solutions of the present disclosure together with the embodiments of the present application, and do not constitute limitations on the technical solutions of the present disclosure.

DETAILED DESCRIPTION OF THE EMBODIMENTS

To make the objectives, technical solutions, and advantages of the present disclosure clearer, the embodiments of the present disclosure will be described in detail below with reference to the drawings. It should be noted that the embodiments in the present application and the features in the embodiments may be arbitrarily combined with each other without conflict.

An flexible OLED display device may be folded or curled like paper. After folding an edge of the flexible display device, narrow border display or even borderless display may be realized, and the screen ratio of the display device is improved. When narrow-border or borderless display is applied to mobile terminal products, it is necessary to set up a mounting hole in the display area of the flexible OLED display device to reserve an installation positions of hardware such as front camera, earpiece, home button or the like on the mobile terminal device.

In the related art, the OLEDs in the OLED display device are very sensitive to water vapor and oxygen. In order to prevent water and oxygen from intruding into the OLEDs, the OLEDs are generally protected by thin film packaging. When the mounting hole is opened in the display area of the flexible OLED display device, the packaging film is cut off at the edge of the mounting hole, so that the OLEDs around the mounting hole will not be protected by the packaging film, resulting in a severely shortened product life. In order to prevent water and oxygen from intruding into the OLEDs from the periphery of the mounting hole, in the related art, an isolation structure is provided around the mounting hole. During the formation of the OLED substrate, the isolation structure causes the light emitting structure layer of the OLED within an area surrounded by the isolation structure to be disconnected with that outside the area surrounded by the isolation structure. Therefore, when the mounting hole is opened in the area surrounded by the isolation structure, water and oxygen will not invade the light emitting structure layer outside the area surrounded by the isolation structure from the periphery of the mounting hole, ensuring the water and oxygen resistance of the effective display area. However, the arrangement of the isolation structure makes the packaging film around the isolation structure relatively thin, and at the same time, the packaging film generates a stress concentration area around the isolation structure. In the stress concentration area, the packaging film is prone to cracks, which eventually leads to the failure of the packaging film and reduces the reliability of the packaging film in the area around the mounting hole.

Figure 1:
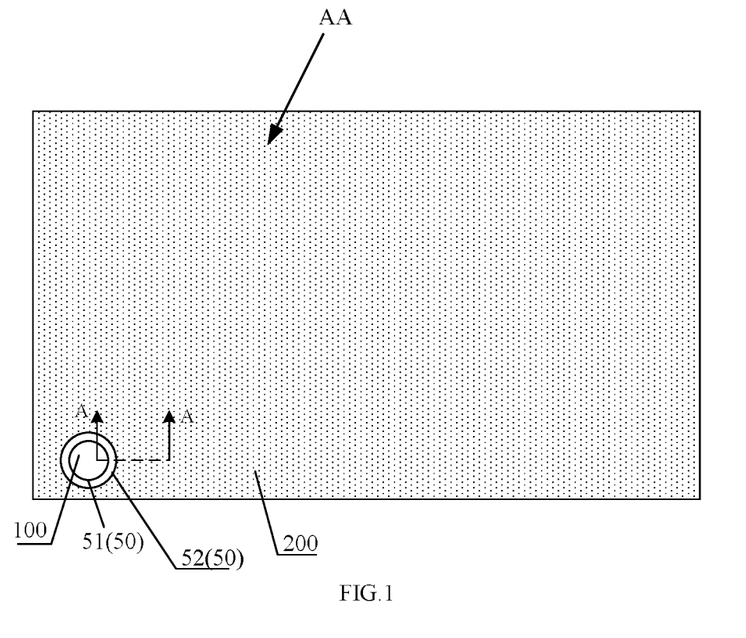
FIG. 1 is a schematic structural top view of an OLED display substrate according to some embodiments of the present disclosure.
Figure 2:
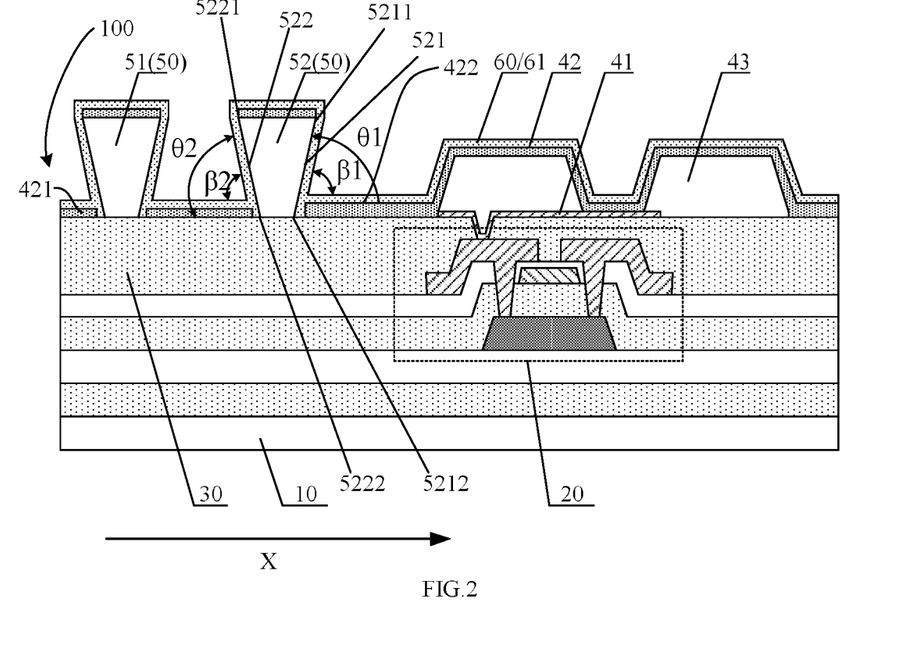
FIG. 2 is a schematic view of the A-A cross-sectional structure in FIG. 1.

FIG. 1 is a schematic structural top view of an OLED display substrate according to some embodiments of the present disclosure. FIG. 2 is a schematic view of the A-A cross-sectional structure in FIG. 1. As shown in FIG. 1, the display substrate has a display area AA. The display area AA includes an opening area 100 and an effective display area 200 located outside the opening area 100. The opening area 100 is used to open a mounting hole for mounting hardware, such as front camera, earpiece, home button or the like, therefore, the opening area 100 is a non-light emitting area.

As shown in FIG. 2, the display substrate includes a base substrate 10, a thin film transistor 20 provided on the base substrate 10, and a planarization layer 30 provided on the thin film transistor 20. The display substrate further includes a first electrode layer 41 disposed on the planarization layer 30, and the first electrode layer 41 is electrically connected to a drain electrode or a source electrode of the thin film transistor 20 through a via hole. The display substrate further includes an isolation structure 50 disposed on a surface of the planarization layer 30 away from the base substrate 10, and the isolation structure surrounds the opening area 100. There may be one or more isolation structures 50. For example, as shown in FIGS. 1 and 2, there are two isolation structures 50. Two isolation structures 50 are sequentially arranged around the opening area 100, that is, a first isolation structure 51 surrounds the opening area 100, and a second isolation structure 52 surrounds the first isolation structure 51. The cross section of the isolation structure 50 has an inverted trapezoid shape. As shown in FIG. 2, the cross sections of the first isolation structure 51 and the second isolation structure 52 have inverted trapezoid shapes. Taking the second isolation structure 52 as an example, as shown in FIGS. 1 and 2, the second isolation structure 52 includes a first side wall 521 facing away from the opening area 100 and a fourth side wall 522 facing to the opening area 100. The first side wall 521 includes a first side 5211 away from the base substrate 10 and a second side 5212 close to the base substrate 10. The first side 5211 is further away from the opening area 100 than the second side 5212 in a direction X parallel to the base substrate 10, that is, the slope angle $\theta 1$ of the first side wall 521 is an acute angle. The fourth side wall 522 includes a fifth side 5221 away from the base substrate 10 and a sixth side 5222 close to the base substrate 10. The fifth side 5221 is closer to the opening area 100 than the sixth side 5222 in the direction X parallel to the base substrate 10, that is, the slope angle $\theta 2$ of the fourth side wall 522 is an acute angle. The first isolation structure 51 has a similar structure. The display substrate further includes a pixel defining layer 43 disposed on the first electrode layer 41, and a light emitting structure layer 42 disposed on the pixel defining layer 43. Since the cross section of the isolation structure 50 has an inverted trapezoidal shape, the light emitting structure layer 42 is cut off at both sides of the isolation structure 50 when the light emitting structure layer 42 is formed, so that the light emitting structure layer 42 is divided by the isolation structure 50 into a first portion 421 located in the area surrounded by the isolation structure 50 and a second portion 422 located in an area surrounding the isolation structure 50.

In the embodiments, the case where the slope angles of both side walls of the isolation structure 50 are acute angles is taken as an example for description. In other embodiments, the isolation structure 50 may have only one side wall with an acute angle of slope. Taking the second isolation structure 52 as an example, the slope angle of one of the first side wall 521 and the fourth side wall 522 of the second isolation structure 52 is an acute angle, and the slope angle of the other is an obtuse angle or a right angle. It may also be achieved that the light emitting structure layer 42 is divided by the isolation structure 50, so that the first portion 421 located in the area surrounded by the isolation structure and the second portion 422 located in the area surrounding the isolation structure are discontinuous. The light emitting structure layer 42 is disconnected at the side wall, provided with an acute angle of slope, of the isolation structure 50.

The display substrate also includes a packaging film substantially covering the entire surface of the base substrate 10. The packaging film includes an inorganic film 60. The isolation structure 50, such as the second isolation structure 52, has an inverted trapezoidal cross-section. Therefore, the slope angles $\theta 1$ and $\theta 2$ of the two side walls of the second isolation structure 52 are both acute angles, which results in that slope angles $\beta 1$ and $\beta 2$ of the inorganic thin film 60 on both sides of the second isolation structure 52 are also acute angles. Since the slope angles $\beta 1$ and $\beta 2$ are acute angles, the vertexes of the slope angles $\beta 1$ and $\beta 2$ become stress concentration areas. Cracks are prone to occur in the stress concentration area, leading to package failure and reducing the reliability of the packaging film around the opening area.

Figure 3:
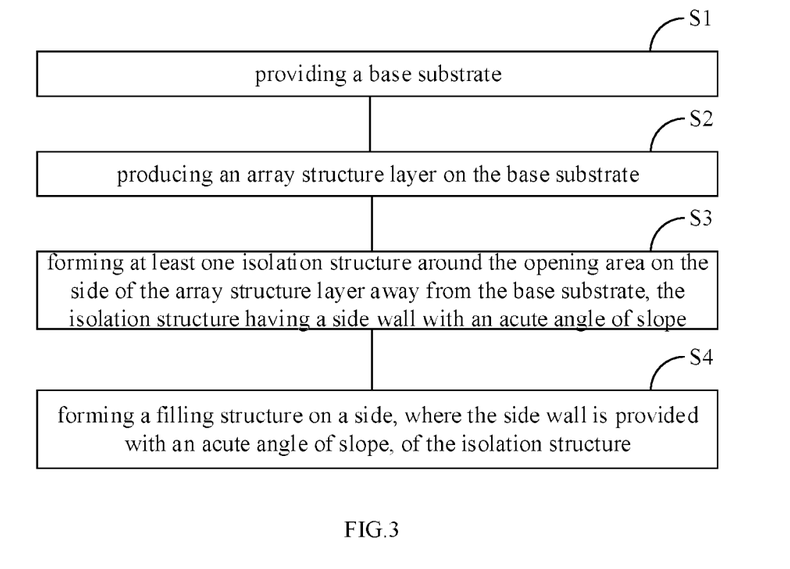
FIG. 3 is a flowchart of a method for manufacturing a display substrate according to some embodiments of the present disclosure.

In order to improve the reliability of the packaging film around the isolation structure, the embodiments of the present disclosure provide a method for manufacturing a display substrate. The display substrate includes a display area AA. The display area AA is provided with an opening area 100 and an effective display area 200 located outside the opening area 100. The opening area 100 is used to open a mounting hole to install hardware such as front camera, earpiece, home key or the like. Therefore, the opening area 100 is a non-light emitting area. FIG. 3 is a flowchart of a method for manufacturing a display substrate according to some embodiments of the present disclosure. The manufacturing method includes:

S1: providing a base substrate;

S2: producing an array structure layer on the base substrate;

S3: forming at least one isolation structure around the opening area on the side of the array structure layer away from the base substrate, the isolation structure having a side wall with an acute angle of slope; and S4: forming a filling structure on a side, where the side wall is provided with an acute angle of slope, of the isolation structure.

In some embodiments, specifically, steps S3 and S4 may be performed as follows.

In the step S3, at least one isolation structure is formed around the opening area on the side of the array structure layer away from the base substrate, wherein the isolation structure includes a first side wall facing away from the opening area. The first side wall includes a first side away from the base substrate and a second side close to the base substrate. The first side is further away from the opening area than the second side in a direction parallel to the base substrate, that is, the slope angle of the first side wall is an acute angle.

In the step S4, a first filling structure is formed on a side of the first side wall away from the opening area, wherein the first filling structure includes a second side wall facing to the first side wall and a third side wall facing away from the first side wall. A shape of the second side wall conforms to a shape of the first side wall. The third side wall includes a third side away from the base substrate and a fourth side close to the base substrate. The third side is closer to the opening area than the fourth side in the direction parallel to the base substrate, that is, the slope angle of the third side wall is an obtuse angle.

In some embodiments, the isolation structure formed in the step S3 further includes a fourth side wall facing to the opening area. The fourth side wall includes a fifth side away from the base substrate and a sixth side close to the base substrate. The fifth side is closer to the opening area than the sixth side in the direction parallel to the base substrate, that is, the slope angle of the fourth side wall is an acute angle. The step S4 further includes forming a second filling structure on a side of the fourth side wall close to the opening area, wherein the second filling structure includes a fifth side wall facing to the fourth side wall and a sixth side wall facing away from the fourth side wall. A shape of the fifth side wall conforms to a shape of the fourth side wall. The sixth side wall includes a seventh side away from the base substrate and an eighth side close to the base substrate. The seventh side is further away from the opening area than the eighth side in the direction parallel to the base substrate, that is, the slope angle of the sixth side wall is an obtuse angle.

In the following embodiments, it is explained as an example that the slope angles of the first side wall and the fourth side wall of the isolation structure are both acute angles.

In the method for manufacturing a display substrate provided by some embodiments of the present disclosure, a filling structure is formed on both sides of the isolation structure, that is, a first filling structure and a second filling structure. The filling structure is used to eliminate the stress concentration areas of the inorganic thin film, thereby avoiding the formation of stress concentration areas on both sides of the isolation structure by the inorganic film, which avoids the inorganic thin film from generating cracks on both sides of the isolation structure. Meanwhile, the uniformity of the thickness of the inorganic thin film is ensured, the packaging performance of the inorganic thin film is ensured, the packaging failure is avoided, and the reliability of the packaging film on both sides of the isolation structure (i.e., around the opening area) is improved.

The technical content of the present disclosure will be described in detail below through specific embodiments. Among them, the "patterning process" mentioned in the embodiments includes processes such as coating photoresist, mask exposure, development, etching, and stripping photoresist, which are existing mature producing processes. The deposition may use known processes such as sputtering, evaporation, chemical vapor deposition, the coating may use a known coating process, and the etching may use a known etching manner, which are not specifically limited herein.

Some embodiments of the present disclosure provide a method for manufacturing a display substrate. The display substrate includes a display area, and an opening area is provided in the display area. The method includes:

S1: provide a base substrate;

S2: producing an array structure layer on the base substrate;

S3: forming at least one isolation structure around the opening area on the side of the array structure layer away from the base substrate, wherein the isolation structure has two side walls, each of which is provided with an acute angle of slope, namely the first side wall and the fourth side wall; and S4: forming a filling structure on both sides of the isolation structure, namely the first filling structure and the second filling structure, which are used to eliminate the stress concentration areas of the inorganic thin film formed on the filling structure.

In the embodiments, before the step S4, the manufacturing method further includes forming a pixel defining layer and a light emitting structure layer; after the step S4, it further includes forming a first inorganic film covering the filling structure and the isolation structure.

A top gate type TFT is taken as an example to describe in detail a method for manufacturing a display substrate of some embodiments of the present disclosure.

In the step S1, a base substrate is provided.

In the step S2, an array structure layer is produced on the base substrate.

Figure 4:
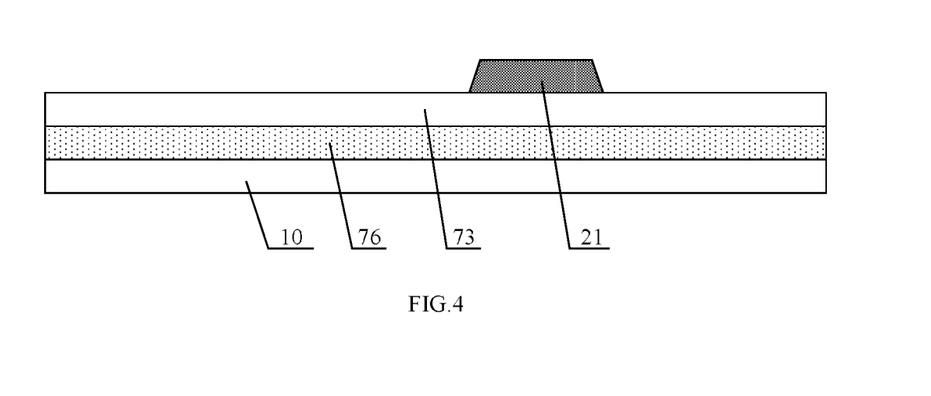
FIG. 4 is a schematic structural view of a display substrate after forming an active layer during a manufacturing process according to some embodiments of the present disclosure.

Specifically, FIG. 4 is a schematic structural view of the display substrate after forming an active layer during a manufacturing process according to some embodiments of the present disclosure. A barrier layer 76, a buffer layer 73, and an active layer 21 are sequentially formed on the base substrate 10. As shown in FIG. 4, the barrier layer 76 and the buffer layer 73 are sequentially formed on the base substrate 10 by using a chemical vapor deposition method. The active layer 21 is formed on the buffer layer 73 through a patterning process. The base substrate 10 may be a flexible substrate, and a material thereof may include polyimide. The material of the barrier layer 76 and the buffer layer 73 may include one or more of silicon nitride, silicon oxide, and silicon oxynitride. The active layer may be made of a material of amorphous silicon, polycrystalline silicon, or microcrystalline silicon, or a metal oxide material, and the metal oxide material may be indium gallium zinc oxide (IGZO) or indium tin zinc oxide (ITZO).

Figure 5:
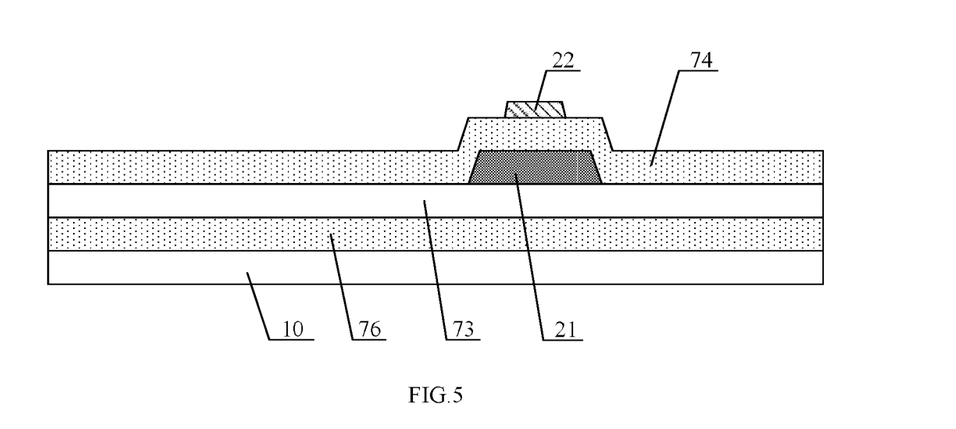
FIG. 5 is a schematic structural view of a display substrate after forming a gate electrode during a manufacturing process according to some embodiments of the present disclosure.

FIG. 5 is a schematic structural view of the display substrate after forming a gate electrode during a manufacturing process according to some embodiments of the present disclosure. A first insulating layer 74 is formed on the active layer 21, and a gate electrode 22 is formed on the first insulating layer 74. As shown in FIG. 5, the first insulating layer 74 may be formed by a method commonly used in the art, such as a chemical vapor deposition method. The gate electrode 22 is formed by a patterning process. The material of the first insulating layer 74 may include one or more of silicon nitride, silicon oxide, and silicon oxynitride, and the material of the gate electrode 22 may include one or more of platinum Pt, ruthenium Ru, gold Au, argentum Ag, molybdenum Mo, Chromium Cr, aluminum Al, tantalum Ta, titanium Ti, wolfram W and other metals.

Figure 6:
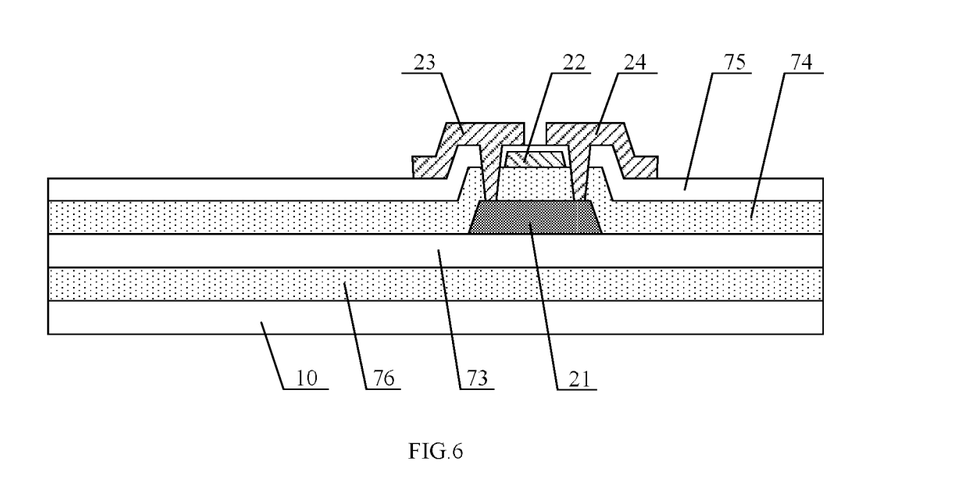
FIG. 6 is a schematic structural view of a display substrate after forming a source electrode and a drain electrode during a manufacturing process according to some embodiments of the present disclosure.

FIG. 6 is a schematic structural view of the display substrate after forming a source electrode and a drain electrode during a manufacturing process according to some embodiments of the present disclosure. A second insulating layer 75 is formed on the gate electrode 22, and a source electrode 23 and a drain electrode 24 are formed on the second insulating layer 75. The source electrode 23 is electrically connected to the active layer 21 through a first via hole penetrating the second insulating layer 75 and the first insulating layer 74, and the drain electrode 24 is electrically connected to the active layer 21 through a second via hole penetrating the second insulating layer 75 and the first insulating layer 74, as shown in FIG. 6. The patterns of the source electrode 23 and the drain electrode 24 may be formed on the second insulating layer 75 by using a patterning process. The materials of the source electrode and the drain electrode may be the same, and may include one or more of platinum Pt, ruthenium Ru, gold Au, argentum Ag, molybdenum Mo, Chromium Cr, aluminum Al, tantalum Ta, titanium Ti, wolfram W and other metals.

Figure 7:
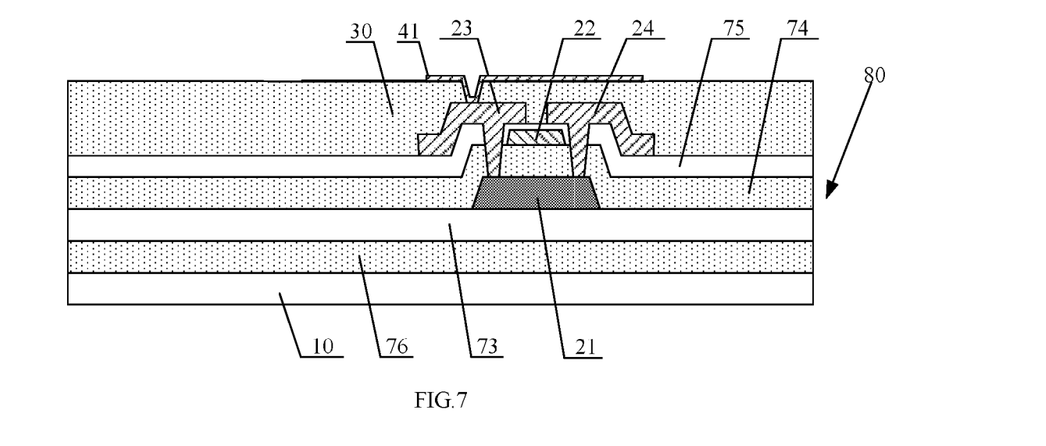
FIG. 7 is a schematic structural view of a display substrate after forming a first electrode layer during a manufacturing process according to some embodiments of the present disclosure.

FIG. 7 is a schematic structural view of the display substrate after forming a first electrode layer during a manufacturing process according to some embodiments of the present disclosure. A planarization layer 30 substantially covering the entire surface of the base substrate 10 is formed on the source electrode 23 and the drain electrode 24, and a first electrode layer 41 is formed on the planarization layer 30. The first electrode layer 41 is electrically connected to the source electrode 23 through a third via hole penetrating the planarization layer 30, as shown in FIG. 7. In the embodiments, the first electrode layer 41 serves as an anode layer of the OLED pixel. It is easy to understand that, in other embodiments, the first electrode layer 41 may also be configured to be electrically connected to the drain electrode 24.

The aforementioned array structure layer 80 includes one or more of the barrier layer 76, the buffer layer 73, the active layer 21, the first insulating layer 74, the gate electrode 22, the second insulating layer 75, the source electrode 23, the drain electrode 24, the planarization layer 30 and the first electrode layers 41.

In the step S3, at least one isolation structure around the opening area is formed on the side of the array structure layer away from the base substrate, and the isolation structure has two side walls, each of which is provided with an acute angle of slope, namely the first side wall and the fourth side wall.

Figure 8:
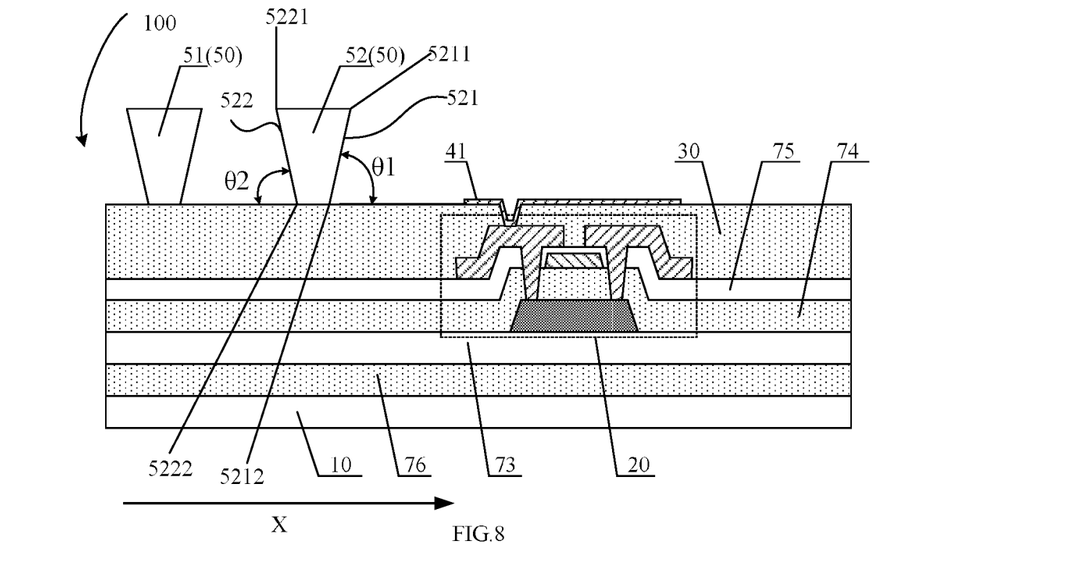
FIG. 8 is a schematic structural view of a display substrate after forming an isolation substrate during a manufacturing process according to some embodiments of the present disclosure.

Specifically, FIG. 8 is a schematic structural view of the display substrate after forming the isolation structure during a manufacturing process according to some embodiments of the present disclosure. As shown in FIG. 8, at least one isolation structure 50 around the opening area 100 is formed on a top surface (i.e., a surface away from the base substrate 10) of the planarization layer 30. The isolation structure 50 has two side walls, each of which is provided with an acute angle of slope. In the embodiments, there are two isolation structures 50. Two isolation structures 50 are sequentially arranged around the opening area 100, that is, the first isolation structure 51 is arranged around the opening area 100, and the second isolation structure 52 is arranged around the first isolation structure 51. The cross section of the isolation structure 50 has an inverted trapezoid shape.

Taking the second isolation structure 52 as an example, as shown in FIGS. 1 and 8, the second isolation structure 52 includes a first side wall 521 facing away from the opening area 100 and a fourth side wall 522 facing to the opening area 100. The first side wall 521 includes a first side 5211 away from the base substrate 10 and a second side 5212 close to the base substrate 10. The first side 5211 is further away from the opening area 100 than the second side 5212 in a direction X parallel to the base substrate 10, that is, the slope angle θ1 of the first side wall 521 is an acute angle. The fourth side wall 522 includes a fifth side 5221 away from the base substrate 10 and a sixth side 5222 close to the base substrate 10. The fifth side 5221 is closer to the opening area 100 than the sixth side 5222 in the direction X parallel to the base substrate 10, that is, the slope angle θ2 of the fourth side wall 522 is an acute angle. The first isolation structure 51 has a similar structure. Therefore, the slope angles θ1 and θ2 of the side walls of the isolation structure 50 are both acute angles. In the embodiments, the isolation structure 50 has a circular ring shape. It is easy to understand that the isolation structure 50 may also have a polygonal shape, as long as the isolation structure 50 has a closed loop shape surrounding the opening area 100. In the embodiments, the material of the isolation structure 50 may include a negative photoresist. A negative photoresist film may be coated on the upper surface of the planarization layer 30, and then a pattern of the isolation structure 50 may be formed by method of exposure and development.

Figure 9:
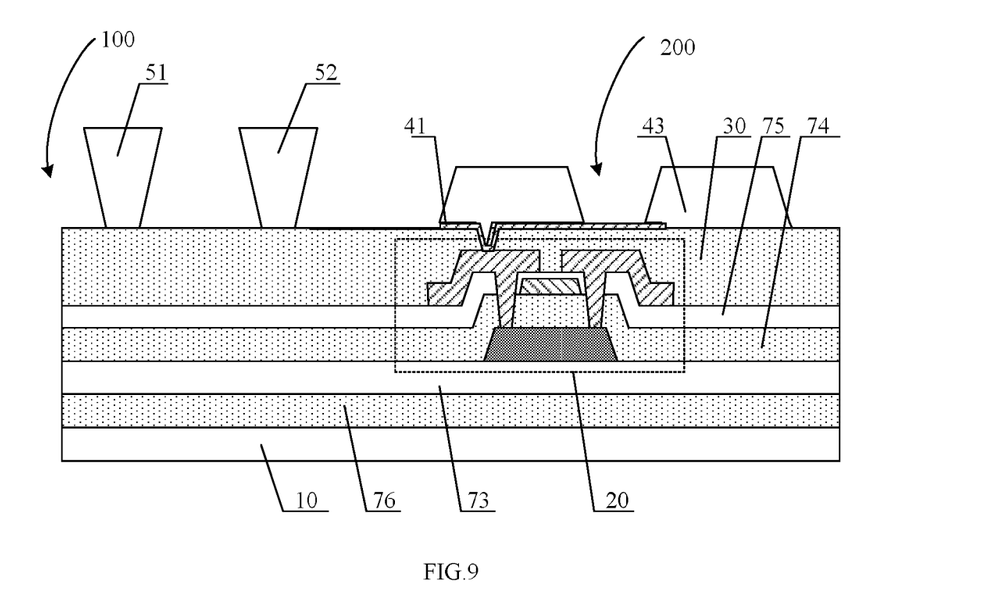
FIG. 9 is a schematic structural view of a display substrate after forming a pixel defining layer during a manufacturing process according to some embodiments of the present disclosure.

Between step S3 and step S4, the manufacturing method of the display substrate further includes: forming a pixel defining layer on the first electrode layer.

Specifically, FIG. 9 is a schematic structural view of the display substrate after forming the pixel defining layer during a manufacturing process according to some embodiments of the present disclosure. As shown in FIG. 9, in the effective display area 200, the pixel defining layer 43 is formed on the first electrode layer 41. In general, a cross-sectional shape of the pixel defining layer 43 has a positive trapezoid shape. In the embodiments, the cross-sectional shape of the isolation structure 50 is an inverted trapezoid, and the cross-sectional shape of the pixel defining layer 43 is a positive trapezoid. At the same time, the material of the isolation structure 50 and the material of the pixel defining layer 43 usually include organic materials, and the isolation structure and the pixel defining layer are formed by exposure and development. In order to form the pixel defining layer 43 without affecting the isolation structure that has been formed, the photoreaction polarity of the material of the pixel defining layer 43 is opposite to the photoreaction polarity of the material of the isolation structure. In the embodiments, the material of the isolation structure 50 includes a negative photoresist, then the material of the pixel defining layer 43 includes a positive photoresist, so as to ensure that the formed Isolation structure will not be affected while forming the pixel defining layer 43.

It is easy to understand that in actual implementation, the order of the step of forming the isolation structure 50 and the step of forming the pixel defining layer 43 may be interchanged.

Between step S3 and step S4, the manufacturing method of the display substrate further includes: forming a light emitting structure layer on the isolation structure and the pixel defining layer.

Figure 10:
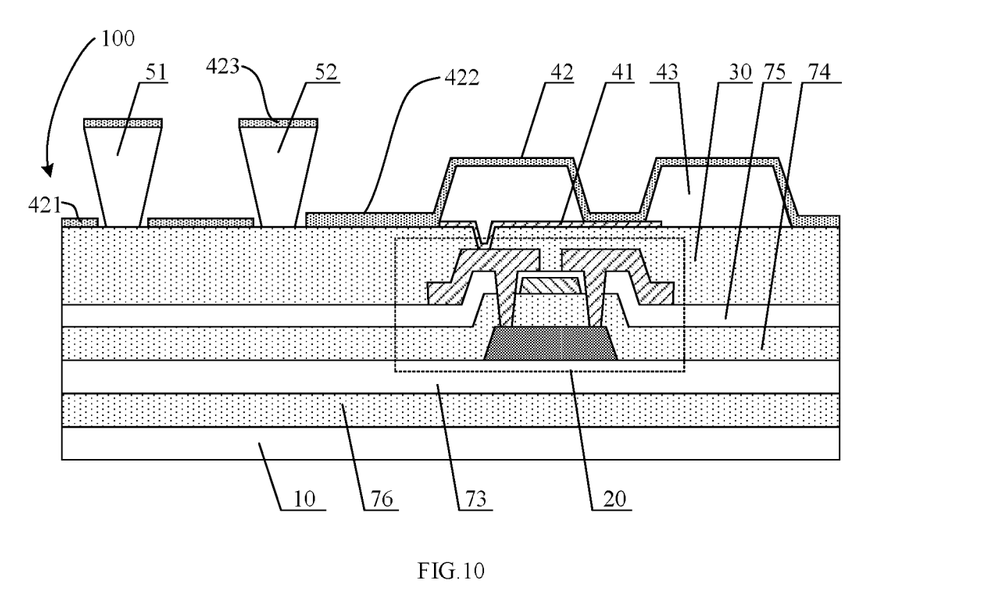
FIG. 10 is a schematic structural view of a display substrate after forming a light emitting structure layer during a manufacturing process according to some embodiments of the present disclosure.

Specifically, FIG. 10 is a schematic view of the display substrate after forming the light emitting structure layer during a manufacturing process according to some embodiments of the present disclosure. As shown in FIG. 10, in general, the light emitting structure layer 42 is formed on the isolation structure and the pixel defining layer 43 by an evaporation method. The slope angle of at least one side wall of the isolation structure 50 is an acute angle. In the embodiments, for the isolation structure 50, taking the second isolation structure 52 as an example, it has a first side wall 521 and a fourth side wall 52 both with an acute angle of slope, the first isolation structure 51 has a similar structure. As a result, when the light emitting structure layer 42 is formed, the light emitting structure layer 42 is divided by the isolation structure 50, and the light emitting structure layer 42 is divided by the isolation structure 50 into a first portion 421 located in the area surrounded by the isolation structure 50, a second portion 422 located in the area surrounding the isolation structure 50, and a third portion 423 located on the upper surface of the isolation structure 50. The first portion 421, the second portion 422, and the third portion 423 are disconnected from each other. It is easily understood that the light emitting structure layer 42 may include, for example, a hole injection layer, a hole transport layer, a light emitting layer, an electron transport layer, and an electron injection layer.

In the step S4, a filling structure which is in contact with both side walls of the isolation structure and is used to eliminate the stress concentration areas of the inorganic thin film formed thereon is formed, and the slope angle of the side wall, for carrying the inorganic thin film, of the filling structure is an obtuse angle.

Figure 11:
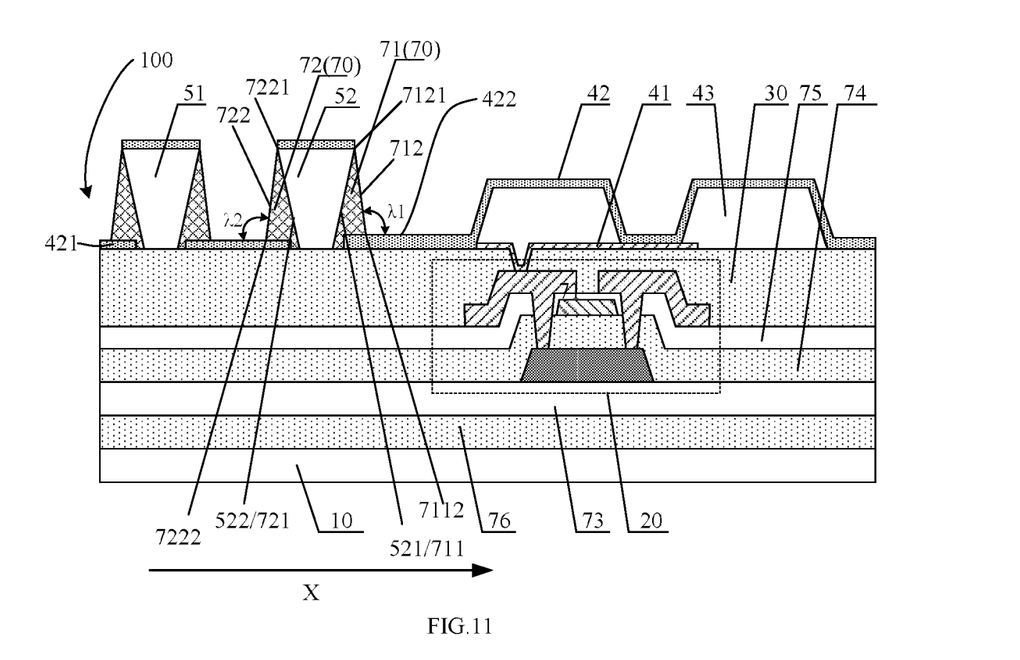
FIG. 11 is a schematic structural view of a display substrate after forming a filling structure during a manufacturing process according to some embodiments of the present disclosure.

Specifically, FIG. 11 is a schematic view of the display substrate after forming the filling structures during a manufacturing process of according to some embodiments of the present disclosure. As shown in FIG. 11, the filling structure 70 on both sides of the isolation structure 50 is formed on the light emitting structure layer 42, and the filling structure 70 is used to eliminate the stress concentration areas of the inorganic thin film subsequently formed thereon. In the embodiments, the second isolation structure 52 is taken as an example for specific description. The cross section of the second isolation structure 52 is inverted trapezoid, in other words, the slope angles of both side walls of the second isolation structure 52 are acute angles, then it is necessary to form the filling structure 70 in contact with the side wall of the structure 52 on both sides of the second isolation structure 52. The filling structure 70 includes a first filling structure 71 and a second filling structure 72.

Specifically, the first filling structure 71 is formed on a side of the first side wall 521 of the second isolation structure 52 away from the opening area 100. The first filling structure 71 includes a second side wall 711 facing to the first side wall 521 and a third side wall 712 facing away from the first side wall 521. The shape of the second side wall 711 conforms to the shape of the first side wall 521. In the embodiments, the second side wall 711 is in contact with the first side wall 521. The third side wall 712 includes a third side 7121 away from the base substrate 10 and a fourth side 7122 close to the base substrate 10. The third side 7121 is closer to the opening area 100 than the fourth side 7122 in the direction X parallel to the base substrate 10, that is, the slope angle λ1 of the third side wall 712 is an obtuse angle. The second filling structure 72 is formed on a side of the fourth side wall 522 of the second isolation structure 52 close to the opening area 100. The second filling structure 72 includes a fifth side wall 721 facing to the fourth side wall 522 and a sixth side wall 722 facing away from the fourth side. The shape of the fifth side wall 721 conforms to the shape of the fourth side wall 522. In the embodiments, the fifth side wall 721 is in contact with the fourth side wall 522. The sixth side wall 722 includes a seventh side 7221 away from the base substrate 10 and an eighth side 7222 close to the base substrate 10. The seventh side 7221 is further away from the opening area 100 than the eighth side 7222 in the direction X parallel to the base substrate 10, that is, the slope angle λ2 of the sixth side wall 722 is an obtuse angle.

After the filling structure 70 is formed, when the inorganic thin film on the filling structure 70 is subsequently formed, the side walls of the second isolation structure 52 no longer carry the inorganic film, but is exposed by the exposed side wall of the filling structure 70, such as the first filling structure 71. The third sidewall 712 and the sixth sidewall 722 of the second filling structure 72 carry an inorganic thin film.

After the filling structure 70 is formed, when the inorganic thin film on the filling structure 70 is subsequently formed, the side wall of the second isolation structure 52 no longer carries the inorganic film, but exposed side walls of the filling structure 70, such as the third side wall 712 of the first filling structure 71 and the sixth side wall 722 of the second filling structure 72, carry the inorganic thin film.

The process of forming the filling structure 70 may include: forming an organic material layer on both sides of the isolation structure 50 on the light emitting structure layer 42 using an inkjet printing method; and patterning the organic material layer (e.g., ashing) to form the pattern of the filling structure 70 contacting both side walls of the isolation structure 50. The slope angle of the side wall of the filling structure 70 for carrying the inorganic thin film is an obtuse angle. In the embodiments, the filling structure 70 is in direct contact with the both side walls, each of which is provided with an acute angle of slope, of the isolation structure 50. The side wall of the filling structure 70 for carrying the inorganic thin film is an exposed sidewall of the filling structure 70, and the slope angle of the exposed sidewall is an obtuse angle. Therefore, the filling structure 70 may eliminate the stress concentration area of the inorganic thin film subsequently formed thereon.

When the organic material is printed on the light emitting structure layer 42 using an inkjet printing method, the organic material liquid will flow and diffuse, so that it can be sufficiently filled at both side walls of the isolation structure 50. In the embodiments, the material of the filling structure 70 may include one or more of PET (polyethylene terephthalate), PEN (polyethylene naphthalate), PI (polyimide), PVC (polyvinyl chloride), PTFE (polytetrafluoroethylene), photoresist, epoxy resin, etc.

Figure 12:
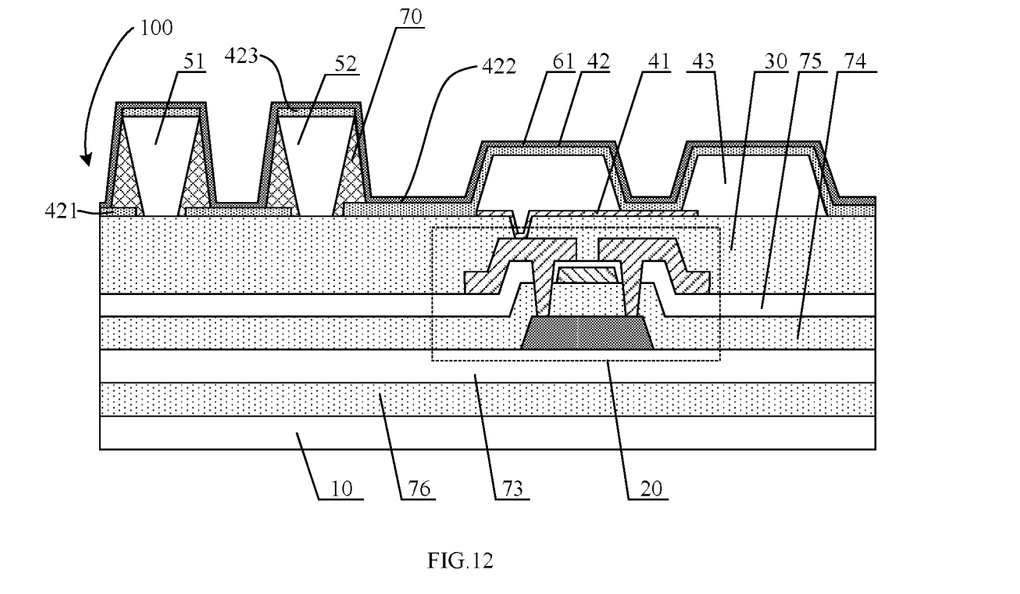
FIG. 12 is a schematic structural view of a display substrate after forming a first inorganic thin film during a manufacturing process according to some embodiments of the present disclosure.

After step S4, the manufacturing method of the display substrate further includes: forming a first inorganic thin film covering the filling structure, specifically including:

FIG. 12 is a schematic structural view of a display substrate after forming a first inorganic thin film during a manufacturing process according to some embodiments of the present disclosure. As shown in FIG. 12, after forming the filling structure 70, the first inorganic thin film 61 covering the filling structure 70 and the isolation structure 50 is formed. The first inorganic thin film 61 may be formed by a chemical vapor deposition method.

In the embodiments, under the action of the filling structure 70, the slope angles of the side walls for supporting the first inorganic thin film on both sides of the isolation structure 50 (i.e., the exposed side walls of the filling structure 70) are obtuse angles. The slope angles of the first inorganic thin film 61 on both sides of the isolation structure 50 are also obtuse angles, so that the stress concentration areas formed by the first inorganic thin film 61 on both sides of the isolation structure 50 may be eliminated. In this way, no cracks are formed on the first inorganic thin film 61 on both sides of the isolation structure 50, thereby ensuring the film thickness uniformity of the first inorganic thin film 61, ensuring the packaging performance of the first inorganic thin film 61, avoiding the packaging failure, and improving the reliability of the packaging film on both sides of the isolation structure (i.e., around the opening area).

It is easily understood that some embodiments of the present disclosure may further include: forming an organic protective layer on the first inorganic thin film 61; and forming a second inorganic thin film on the organic protective layer. The organic protective layer and the second inorganic thin film may be formed by methods known in the art.

In the above embodiments, the thin film transistors on the array structure layer are top-gate thin film transistors. It is easy to understand that the manufacturing method of the display substrate proposed by some embodiments of the present disclosure is also applicable to bottom-gate thin film transistors.

Some embodiments of the present disclosure provide a method for manufacturing a display substrate. The display substrate includes a display area AA, and an opening area 100 is provided in the display area AA. The manufacturing method includes:

S1: provide a substrate;

S2: producing an array structure layer on the base substrate;

S3: forming at least one isolation structure around the opening area on the side of the array structure layer away from the base substrate, wherein the isolation structure has two side walls, each of which is provided with an acute angle of slope, namely a first side wall and a fourth side wall.

S4: forming a filling structure on both sides of the isolation structure, namely, the first filling structure and the second filling structure, which are used to eliminate the stress concentration area of the inorganic thin film formed on the filling structure.

In the embodiments, before the step S4, the manufacturing method further includes forming a pixel defining layer and a light emitting structure layer, and forming a first inorganic thin film covering the isolation structure. In the step S4, the organic protective layer is also formed in an area on a side of the isolation structure away from the opening area 100, for example, the effective display area 200. After the step S4, the manufacturing method further includes forming a second inorganic thin film covering both the filling structure and the isolation structure.

The manufacturing method of the display substrate provided by some embodiments of the present disclosure will be described in detail below by taking a top-gate TFT as an example.

In the embodiments, the steps S1-S3 and the steps of forming the pixel defining layer and the light emitting structure layer are the same as those in the previous embodiments, and will not be repeated here.

Between the step S3 and the step S4, the manufacturing method of the display substrate further includes: forming a first inorganic thin film covering the isolation structure.

Specifically, referring to FIG. 2, a first inorganic thin film 61 covering the isolation structure 50 is formed on the light emitting structure layer 42, the first inorganic thin film 61 substantially covers the entire upper surface of the base substrate 10, that is, the first inorganic thin film 61 also covers an outer surface of the isolation structure 50. The first inorganic thin film 61 may be formed on the light emitting structure layer 42 using a chemical vapor deposition method.

In the step S4, a filling structure which is in contact with the first inorganic thin film and is used to eliminate the stress concentration area of the second inorganic thin film subsequently formed thereon is formed on both sides of the isolation structure. The slope angle of the side wall of the filling structure which is used to carry the second inorganic thin film is an obtuse angle.

Figure 13:
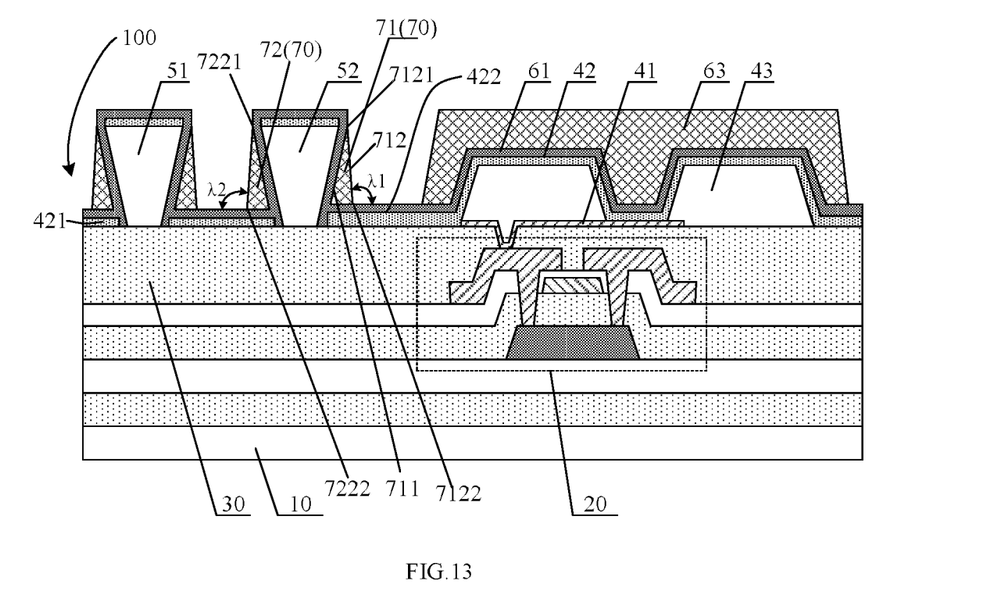
FIG. 13 is a schematic structural view of a display substrate after forming a filling structure during a manufacturing process according to some embodiments of the present disclosure.

Specifically, FIG. 13 is a schematic structural view of a display substrate after forming a filling structure during a manufacturing process according to some embodiments of the present disclosure. The process of forming the filling structure may include: forming an organic material layer filling both sides of the isolation structure 50 on the first inorganic thin film 61 using an inkjet printing method; patterning the organic material layer to form an pattern of the filling structure 70 which is in contact with the two side walls of the isolation structure 50 through the first inorganic thin film 61, the filling structure 70 includes a first filling structure 71 and a second filling structure 72.

Specifically, a first filling structure 71 is formed on a side of the first side wall 521 of the second isolation structure 52 away from the opening area 100. The first filling structure 71 includes a second side wall 711 facing to the first side wall 521 and a third side wall 712 facing away from the first side wall 521. The shape of the second side wall 711 conforms to the shape of the first side wall 521. In the embodiments, the second side wall 711 is in contact with the first inorganic thin film 61. The third side wall 712 includes a third side 7121 away from the base substrate 10 and a fourth side 7122 close to the base substrate 10. The third side 7121 is closer to the opening area 100 than the fourth side 7122 in the direction X parallel to the base substrate 10, that is, the slope angle λ1 of the third side wall 712 is an obtuse angle. A second filling structure 72 is formed on the side of the fourth side wall 522 of the second isolation structure 52 close to the opening area 100. The second filling structure 72 includes a fifth side wall 721 facing to the fourth side wall 522 and a sixth side wall 722 facing away from the fourth side wall 522. The shape of the fifth side wall 721 conforms to the shape of the fourth side wall 522. In the embodiments, the fifth side wall 721 contacts the first inorganic thin film 61. The sixth side wall 722 includes a seventh side 7221 away from the base substrate 10 and an eighth side 7222 close to the base substrate 10. The seventh side 7221 is further away from the opening area 100 than the eighth side 7222 in the direction X parallel to the base substrate 10, that is, the slope angle λ2 of the sixth side wall 722 is an obtuse angle.

The slope angles of the side walls of the filling structure 70 for carrying the second inorganic thin film to be formed are obtuse angles. Therefore, the filling structure 70 may eliminate the stress concentration area of the second inorganic thin film formed subsequently thereon. In the embodiments, the formed organic material layer covers the entire upper surface of the substrate. Therefore, when the organic material layer is patterned to form the filling structure 70, the pattern of the organic protective layer 63 may be simultaneously formed. In the embodiments, the filling structure 70 and the organic protective layer 63 are formed by the same process. The organic protective layer 63 may play a role in planarization, and may also reduce the stress of the inorganic thin film in contact therewith.

When the organic material is printed on the first inorganic thin film 61 by the inkjet printing method, the organic material liquid will flow and diffuse, so that it can be sufficiently filled at both sides of the isolation structure 50. In the embodiments, the material of the filling structure 70 may include one or more of PET (polyethylene terephthalate), PEN (polyethylene naphthalate), PI (polyimide), PVC (polyvinyl chloride), PTFE (polytetrafluoroethylene), photoresist, epoxy resin, etc.

As shown in FIG. 13, the filling structure 70 located on both sides of the isolation structure 50 is formed on the first inorganic thin film 61, and the filling structure is used to eliminate the stress concentration area of the second inorganic thin film subsequently formed thereon. Specifically, the filling structure 70 is formed at both side walls of the isolation structure 50, where the slope angle is an acute angle. The slope angle of the side wall of the filling structure 70 for supporting the second inorganic thin film formed thereon (i.e., the exposed side wall of the filling structure 70, for example, the third side wall 712 of the first filling structure 71 and the sixth side wall 722 of the second filling structure 72) is an obtuse angle, so that the filling structure 70 may eliminate the stress concentration area of the second inorganic thin film subsequently formed thereon. In the embodiments, the second isolation structure 52 is taken as an example for specific description. The cross section of the second isolation structure 52 is inverted trapezoid, that is to say, the slope angles of the side walls of the second isolation structure 52 are both acute angles, then it is necessary to form filling structure 70 on both sides of the second isolation structure 52 respectively. After the filling structure 70 is formed, when the second inorganic thin film for packaging is subsequently formed, the two side walls of the second isolation structure 52 no longer carry the second inorganic thin film, but the exposed side wall of the filling structure 70 carries the second inorganic thin film.

After the step S4, the manufacturing method of the display substrate further includes: forming a second inorganic thin film covering the filling structure.

Figure 14:
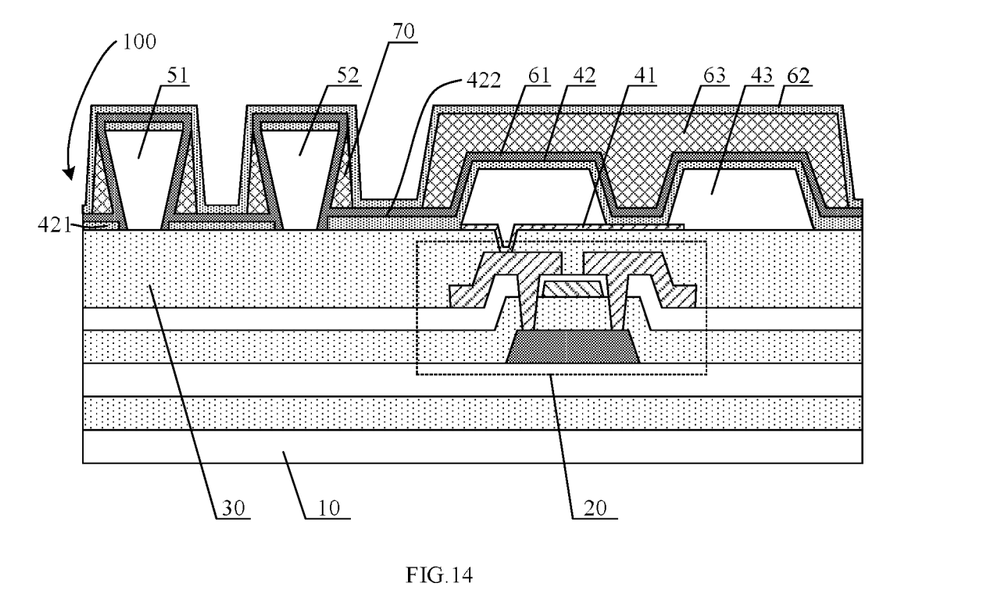
FIG. 14 is a schematic structural view of a display substrate after forming a second inorganic thin film during a manufacturing process according to some embodiments of the present disclosure.

Specifically, FIG. 14 is a schematic structural view of the display substrate after forming a second inorganic thin film during a manufacturing process according to some embodiments of the present disclosure. As shown in FIG. 14, the second inorganic thin film 62 is formed on the entire surface of the base substrate 10 on which the filling structure 70 and the organic protective layer 63 are formed. The second inorganic thin film 62 may be formed by a chemical vapor deposition method.

In the embodiments, under the action of the filling structure 70, the slope angles of the side walls for supporting the second inorganic thin film on both sides of the isolation structure 50 (i.e., the exposed side wall of the filling structure 70) are obtuse angles, thus, the slope angles of the second inorganic film 62 on both sides of the isolation structure 50 are also obtuse angles, so that the stress concentration areas formed by the second inorganic film 62 on both sides of the isolation structure 50 may be eliminated. In this way, no cracks are formed on the second inorganic film 62 on both sides of the isolation structure 50, thereby ensuring the film thickness uniformity of the second inorganic film 62, ensuring the packaging performance of the second inorganic film 62, avoiding the package failure, and improving the reliability of the packaging film on both sides of the isolation structure 50 (i.e., around the opening area 100).

In the above embodiments, the thin film transistors on the array structure layer are top-gate thin film transistors. It is easy to understand that the manufacturing methods of the display substrate proposed by some embodiments of the present disclosure are also applicable to bottom-gate thin film transistors.

Some embodiments of the present disclosure provide a display substrate. As shown in FIGS. 1 and 12, the display substrate includes a display area AA. The display area AA is provided with an opening area 100 and an effective display area 200 except the opening area 100. The display substrate includes: a base substrate 10, and an array structure layer 80 disposed on the base substrate 10; and at least one isolation structure 50 disposed on a side of the array structure layer 80 away from the base substrate 10 and around the opening area 100. The isolation structure 50 has a side wall with an acute angle of slope. In the embodiments, the isolation structure 50 has a shape of an inverted trapezoid, and the slope angles of both side walls thereof are acute angles.

The display substrate further includes a filling structure 70 disposed on both sides of the isolation structure 50 for eliminating the stress concentration area of the inorganic thin film formed thereon, and the slope angle of the side wall of the filling structure 70 for carrying the inorganic thin film is an obtuse angle.

The array structure layer 80 may include a thin film transistor 20 disposed on the base substrate 10, a planarization layer 30 disposed on the thin film transistor 20, and a first electrode layer 41 disposed on the planarization layer 30. The isolation structure 50 is provided on a surface of the planarization layer 30 away from the base substrate 10. It is easy to understand that the thin film transistor 20 and the first electrode layer 41 are both disposed in an area (i.e., the effective display area 200) on a side of the isolation structure 50 away from the opening area 100.

The display substrate further includes a pixel defining layer 43 disposed on the first electrode layer 41, and a light emitting structure layer 42 disposed on the isolation structure 50 and the pixel defining layer 43. The light emitting structure layer 42 is divided by the isolation structure 50 into a first portion 421 located in an area surrounded by the isolation structure 50 and a second portion 422 located in an area surrounding the isolation structure 50. The first portion 421 and the second portion 422 are disconnected from each other. The filling structure 70 is disposed on the light emitting structure layer 42.

Further, the display substrate further includes a first inorganic thin film 61 covering both the filling structure 70 and the isolation structure 50.

The display substrate may further include an organic protective layer disposed on the first inorganic thin film and a second inorganic thin film disposed on the organic protective layer.

Some embodiments of the present disclosure provide a display substrate. As shown in FIGS. 1 and 14, the display substrate includes a display area AA, and an opening area 100 is provided in the display area and an effective display area 200 except the opening area 100. The display substrate includes: a base substrate 10, an array structure layer 80 disposed on the base substrate 10; and at least one isolation structure 50 disposed on a side of the array structure layer 80 away from the base substrate 10 and around the opening area 100. The isolation structure 50 has a side wall with an acute angle of slope. In the embodiments, the isolation structure 50 has a shape of an inverted trapezoid, and the slope angles of both side walls thereof are acute angles.

The display substrate further includes a filling structure 70 disposed on both sides of the isolation structure 50 for eliminating the stress concentration area of the inorganic thin film formed thereon. The slope angle of the side wall of the filling structure 70 for carrying the inorganic thin film is an obtuse angle.

The array structure layer 80 may include a thin film transistor 20 disposed on the base substrate 10, a planarization layer 30 disposed on the thin film transistor 20, and a first electrode layer 41 disposed on the planarization layer 30. The isolation structure 50 is provided on a surface of the planarization layer 30 away from the base substrate 10. It is easy to understand that the thin film transistor 20 and the first electrode layer 41 are both disposed in an area (i.e., the effective display area 200) on a side of the isolation structure 50 away from the opening area 100.

The display substrate further includes a pixel defining layer 43 disposed on the first electrode layer 41, and a light emitting structure layer 42 disposed on the isolation structure 50 and the pixel defining layer 43. The light emitting structure layer 42 is divided by the isolation structure 50 into a first portion 421 located in an area surrounded by the isolation structure 50 and a second portion 422 located in an area surrounding the isolation structure 50. The first portion 421 and the second portion 422 are disconnected from each other.

Further, the display substrate further includes a first inorganic thin film 61 covering the isolation structure 50. The filling structure 70 is disposed on the first inorganic thin film 61, and the filling structure 70 contacts the first side wall of the isolation structure 50 through the first inorganic thin film 61.

The display substrate may further include an organic protective layer 63 disposed on the first inorganic thin film 61, and a second inorganic thin film 62 covering the filling structure 70, the isolation structure 50, and the organic protective layer 63. The organic protective layer 63 and the filling structure 70 are formed by the same process. The organic protective layer 63 is disposed in the effective display area 200, which may play a role in planarization, and may also reduce the stress of the inorganic film layer in contact therewith.

Based on the inventive concepts of the foregoing embodiments, some embodiments of the present disclosure also provide a display device including the display substrate of the foregoing embodiments. The display device may be any product or component with a display function, such as a mobile phone, a tablet computer, a television, a display, a notebook computer, a digital photo frame, a navigator, and the like.

In the description of the embodiments of the present disclosure, it should be understood that the orientations or positional relationships indicated by the terms "upper", "lower", "front", "rear", "top", "bottom", "inner", "outer", etc. are based on the orientations or positional relationships shown in the drawings, and is merely for the convenience of describing the present disclosure and simplifying the description, rather than indicating or implying that the device or element referred to must have specific orientations, or be constructed and operated in specific orientations, and therefore they may not be construed as limitations of the present disclosure In the description of the embodiments of the present disclosure, it should be noted that, unless otherwise clearly specified and limited, the term "contact" should be understood in a broad sense, for example, it may be directly connected or indirectly contacted through an intermediate medium. For those skilled in the art, the specific meaning of the above terms in the present disclosure may be understood in specific situations.

Although the embodiments disclosed in the present disclosure are as described above, the described contents are only the embodiments adopted to facilitate understanding of the present disclosure, and are not intended to limit the present disclosure. Any person skilled in the art to which this disclosure belongs may make any modifications and changes in the form and details of implementation without departing from the spirit and scope disclosed in the present disclosure, but the patent protection scope of the present disclosure still needs to be subject to the scope defined in the appended claims.

What is claimed is:

1. A method for manufacturing a display substrate, the display substrate having a display area, and an opening area being provided in the display area, wherein the method comprises:
    providing a base substrate;
    forming at least one isolation structure around the opening area on the base substrate, wherein the isolation structure comprises a first side wall facing away from the opening area, the first side wall comprises a first side and a second side, the second side is closer to the base substrate than the first side, the first side is further away from the opening area than the second side in a direction parallel to the base substrate; and
    forming a first filling structure on a side of the first side wall away from the opening area, wherein the first filling structure comprises a second side wall facing to the first side wall and a third side wall facing away from the first side wall, the second side wall conforms to a shape of the first side wall, the third side wall comprises a third side and a fourth side, the fourth side is closer to the base substrate than the third side, the third side is closer to the opening area than the fourth side in the direction parallel to the base substrate.

2. The method according to claim 1, wherein the isolation structure further comprises a fourth side wall facing to the opening area, the fourth side wall comprises a fifth side and a sixth side, the sixth side is closer to the base substrate than the fifth side, the fifth side is closer to the opening area than the sixth side in the direction parallel to the base substrate;
    the method further comprises:
    forming a second filling structure on a side of the fourth side wall facing to the opening area, wherein the second filling structure comprises a fifth side wall facing to the fourth side wall and a sixth side wall facing away from the fourth side wall, the fifth side wall conforms to a shape of the fourth side wall, the sixth side wall comprises a seventh side and an eighth side, the eighth side closer to the base substrate than the seventh side, the seventh side is further away from the opening area than the eighth side in the direction parallel to the base substrate.

3. The method according to claim 2, further comprising:
    filling an organic material layer on both sides of the isolation structure; and
    patterning the organic material layer to form the first filling structure and the second filling structure.

4. The method according to claim 3, wherein the organic material layer is filled with an inkjet printing method.

5. The method according to claim 2, wherein, after forming the first filling structure and the second filling structure, the method further comprises:
    forming a first inorganic thin film covering the first filling structure and the second filling structure.

6. The method according to claim 2, wherein, before forming the first filling structure and the second filling structure, the method further comprises:
    forming a first inorganic thin film covering the isolation structure.

7. The method according to claim 6, further comprising:
    forming an organic protective layer on the side of the first side wall away from the opening area;
    wherein the organic protective layer, the first filling structure and the second filling structure are formed by the same patterning process.

8. The method according to claim 7, further comprising:
    forming a second inorganic thin film covering all of the first filling structure and second filling structure and the organic protective layer.

9. The method according to claim 1, wherein, before forming the isolation structure, the method further comprises:
    forming an array structure layer on the base substrate;
    wherein the isolation structure is formed on a side of the array structure layer away from the base substrate.

10. A display substrate having a display area, an opening area being provided in the display area, wherein the display substrate comprises:
    a base substrate;
    at least one isolation structure provided on the base substrate and surrounding the opening area, wherein the isolation structure comprises a first side wall facing away from the opening area, the first side wall comprises a first side and a second side, the second side is closer to the base substrate than the first side, the first side is further away from the opening area than the second side in a direction parallel to the base substrate; and a first filling structure provided on a side of the first side wall away from the opening area, wherein the filling structure comprises a second side wall facing to the first side wall and a third side wall facing away from the first side wall, the second side wall conforms to a shape of the first side wall, the third side wall comprises a third side and a fourth side, the fourth side is closer to the base substrate than the third side, the third side is closer to the opening area than the fourth side in the a direction parallel to the base substrate.

11. The display substrate according to claim 10, wherein the isolation structure further comprises a fourth side wall facing to the opening area, the fourth side wall comprises a fifth side and a sixth side, the sixth side is closer to the base substrate than the fifth side, the fifth side is closer to the opening area than the sixth side in the direction parallel to the base substrate;

the isolation structure further comprises:

a second filling structure provided on a side of the fourth side wall facing to the opening area, wherein the second filling structure comprises a fifth side wall facing to the fourth side wall and a sixth side wall facing away from the fourth side wall, the fifth side wall conforms to a shape of the fourth side wall, the sixth side wall comprises a seventh side and an eighth side, the eighth side is closer to the base substrate than the seventh side, the seventh side is further away from the opening area than the eighth side in the direction parallel to the base substrate.

12. The display substrate according to claim 11, further comprising a first inorganic thin film covering both the first filling structure and the second filling structure.

13. The display substrate according to claim 11, further comprising a first inorganic thin film disposed between the isolation structure and a filling structure comprising the first filling structure and the second filling structure.

14. The display substrate according to claim 13, further comprising an organic protective layer provided on the side of the first side wall away from the opening area.

15. The display substrate according to claim 14, further comprising a second inorganic thin film covering both the filling structure and the organic protective layer.

16. The display substrate according to claim 10, further comprising:

an array structure layer provided on the base substrate;
wherein the isolation structure is disposed on a side of the array structure layer away from the base substrate.

17. The display substrate according to claim 10, the display substrate is an OLED display substrate.

18. A display device, comprising the display substrate according to claim 10.

* * * * *